United States Patent
Trivedi et al.

(10) Patent No.: US 7,514,366 B2
(45) Date of Patent: Apr. 7, 2009

(54) METHODS FOR FORMING SHALLOW TRENCH ISOLATION

(75) Inventors: Jigish D. Trivedi, Boise, ID (US); Robert D. Patraw, Boise, ID (US); Kevin L. Beaman, Boise, ID (US); John A. Smythe, III, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 11/470,150

(22) Filed: Sep. 5, 2006

(65) Prior Publication Data

US 2007/0004131 A1 Jan. 4, 2007

Related U.S. Application Data

(62) Division of application No. 10/925,715, filed on Aug. 24, 2004, now Pat. No. 7,271,464.

(51) Int. Cl.
*H01L 21/311* (2006.01)
(52) U.S. Cl. .............. 438/700; 438/724; 438/744; 438/756; 438/680; 257/E21.17; 257/E21.267; 257/E21.293; 257/E21.304
(58) Field of Classification Search ................ 438/238, 438/381, 637, 680, 700, 724, 744, 756
See application file for complete search history.

(56) References Cited

U.S. PATENT DOCUMENTS

| | | | |
|---|---|---|---|
| 4,855,804 A | 8/1989 | Bergami et al. | |
| 5,087,586 A | 2/1992 | Chan et al. | |
| 5,190,889 A * | 3/1993 | Poon et al. | 438/437 |
| 5,387,540 A * | 2/1995 | Poon et al. | 438/430 |
| 5,447,884 A | 9/1995 | Fahey et al. | |
| 5,492,858 A | 2/1996 | Bose et al. | |
| 5,702,976 A | 12/1997 | Schuegraf et al. | |
| 5,869,384 A | 2/1999 | Yu et al. | |
| 5,926,717 A | 7/1999 | Michael et al. | |
| 5,943,585 A | 8/1999 | May et al. | |
| 6,027,982 A | 2/2000 | Peidous et al. | |
| 6,037,238 A | 3/2000 | Chang et al. | |
| 6,046,487 A * | 4/2000 | Benedict et al. | 257/510 |
| 6,187,651 B1 * | 2/2001 | Oh | 438/435 |
| 6,316,331 B1 | 11/2001 | Tseng | |
| 6,461,937 B1 * | 10/2002 | Kim et al. | 438/431 |
| 6,500,726 B2 | 12/2002 | Lee et al. | |

(Continued)

OTHER PUBLICATIONS

Advertisement entitled "Polysilazane SODs Spinfit™ 400 series for STI/PMD application.", date unknown.
Peters, Laura, "Choices and challenges for shallow trench isolation," Semiconductor International, Website www.reed-electronics.com, Apr. 1, 1999, 6 pages.

*Primary Examiner*—David Nhu
(74) *Attorney, Agent, or Firm*—Knobbe Martens Olson & Bear (57) ABSTRACT

A method of depositing dielectric material into sub-micron spaces and resultant structures is provided. After a trench is etched in the surface of a wafer, a silicon nitride barrier is deposited into the trench. The silicon nitride layer has a high nitrogen content near the trench walls to protect the walls. The silicon nitride layer further from the trench walls has a low nitrogen content and a high silicon content, to allow improved adhesion. The trench is then filled with a spin-on precursor. A densification or reaction process is then applied to convert the spin-on material into an insulator. The resulting trench has a well-adhered insulator which helps the insulating properties of the trench.

42 Claims, 7 Drawing Sheets

U.S. PATENT DOCUMENTS

| | | |
|---|---|---|
| 6,518,148 B1 | 2/2003 | Cheng et al. |
| 6,576,558 B1 | 6/2003 | Lin et al. |
| 6,657,276 B1 | 12/2003 | Karlsson et al. |
| 6,699,799 B2 | 3/2004 | Ahn et al. |
| 6,717,231 B2 | 4/2004 | Kim et al. |
| 6,956,276 B2 | 10/2005 | Hokazono |
| 7,176,104 B1 | 2/2007 | Chen et al. |
| 7,271,463 B2 | 9/2007 | Smythe, III et al. |
| 2002/0022326 A1 | 2/2002 | Kunikiyo |
| 2002/0064937 A1 | 5/2002 | Kim et al. |
| 2003/0022522 A1 | 1/2003 | Nishiyama et al. |
| 2004/0099928 A1 | 5/2004 | Nunan et al. |

\* cited by examiner

FIG. 7

METHODS FOR FORMING SHALLOW TRENCH ISOLATION

CROSS-REFERENCE TO RELATED APPLICATIONS

This application is a divisional of U.S. patent application Ser. No. 10/925,715, filed Aug. 24, 2004, and is incorporated herein by reference.

FIELD OF THE INVENTION

This invention relates generally to the field of integrated circuit fabrication, and more specifically to trench isolation and methods therefor.

BACKGROUND OF THE INVENTION

Integrated circuit (IC) manufacturers increasingly face difficulties with scaling and insulation between components with ever decreasing feature sizes. Even though packing transistors closer is important to the concept of increasing IC speed and decreasing size, they must still be electrically separated from each other. One method of keeping transistors separate from each other is known as trench isolation. Trench isolation is the practice of creating trenches in the substrate in order to separate electrical components on the chip. The trenches are typically filled with an insulator that will prevent cross-talk between transistors.

Shallow trench isolation (STI), which is becoming quite prevalent in modern IC design, uses trenches that are substantially narrower than previous isolation technology, such as LOCal Oxidation of Silicon (LOCOS). The size can vary, but a trench less than one half of a micron wide has become quite common. STI also offers smaller channel width encroachment and better planarity than technologies used in earlier IC generations.

During the deposition process and subsequent steps, however, the trench walls can be damaged. A silicon nitride liner in an STI trench has substantial stress-relieving capabilities for the sidewalls of the trench. Such liners are often used for high density ICs, such as dynamic random access memory (DRAM) chips, to protect the bulk silicon during subsequent process steps.

In order to provide good isolation properties, the trench is then typically filled with an insulator such as a form of silicon oxide. The oxide can be deposited in a number of methods, such as CVD, sputtering, or a spin-on deposition process. Spin-on insulators, or spin-on dielectrics (SOD), can be deposited evenly. Additionally, SOD materials, which often form silicon oxide after being reacted, carry less risk of voids in the resulting insulating material than other deposition processes. The SOD precursor is reacted to form silicon oxide using a high temperature oxidation process.

However, problems relating to the formation of the SOD are common and can cause significant problems for IC designers. In particular, interface problems between the SOD and the trench walls are common. Accordingly, better methods of SOD integration are needed for trenches.

SUMMARY OF THE INVENTION

In one aspect of the invention, an isolation structure for an integrated circuit is disclosed. The isolation structure comprises a trench formed within a substrate. The trench has sidewalls and a base. A silicon nitride layer is within the trench. A portion of the silicon nitride layer at the sidewalls and base of the trench has a higher level of nitrogen than a portion of the silicon nitride layer most removed from the sidewalls and the base of the trench. An insulating material is within the silicon nitride layer.

In another aspect of the invention, a method of forming an isolation structure is disclosed. The method comprises forming a recess with a base and sidewalls within a substrate. A first nitride layer is deposited within the recess and a silicon-rich second nitride layer is deposited over the first nitride layer. An insulator precursor within the second nitride layer is deposited.

In another aspect of the invention, a method of isolating electrical components in an integrated circuit is disclosed. The method comprises forming a trench within a substrate. A silicon nitride layer is deposited within and lining the trench. The silicon nitride layer is deposited by adjusting the deposition of the silicon nitride layer to produce a lower nitrogen content in an interior portion of the nitride layer compared to an outside portion of the silicon nitride layer. A silicon oxide precursor is deposited within the silicon nitride layer.

In another aspect of the invention, a method of isolating electrical components on a substrate is disclosed. The method comprises forming a recess in the substrate and depositing a graded silicon nitride layer within the recess. Depositing the silicon nitride layer comprises decreasing a nitrogen percentage while depositing the silicon nitride layer. An insulation precursor is deposited after depositing the silicon nitride layer. An insulator is formed from the insulation precursor.

A method of forming an isolation trench in an integrated circuit is disclosed in another aspect of the invention. The method comprises forming a trench in a substrate. The trench is lined with a silicon nitride layer, wherein the silicon nitride layer has a nitrogen content by atomic weight of less than 34%. The method further comprises depositing an insulator in the trench after lining the trench A method of forming an isolation trench is disclosed in another aspect of the invention. The method comprises lining a trench with a barrier layer and depositing an adhesion layer over the barrier layer. The adhesion layer has a silicon content by weight of between about 66% and 88%. The method further comprises depositing a spin-on insulation precursor in the recess after depositing the adhesion layer. An insulator is formed from the insulation precursor.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Shallow trench isolation (STI) trenches in dynamic random access memory devices are typically lined with a silicon nitride layer. However, silicon oxide formed from a spin-on dielectric (SOD) precursor has been found to adhere poorly to conventional barrier materials, such as stoichiometric silicon nitride, $Si_3N_4$. However, a nitrogen-poor material will not effectively protect the trench and the active area of the bulk silicon from damage from processing.

In part, the adhesion problem is due to poor re-bonding, which makes the interface between the silicon oxide and the silicon nitride weak. During the densification process, the SOD precursor bonds with the walls of the surrounding material to form a blended interface which provides a stable isolation structure. During the densification, the weakest bonds, those between silicon and hydrogen, are broken down first. When a silicon-rich surface is provided as an underlayer for the formation of a SOD layer, more silicon is available for re-bonding at the silicon nitride/silicon oxide interface.

In order to improve the adhesion, the preferred embodiments provide a higher silicon content near the interior of the trench. Preferably, the portions of the liner closest to the trench walls and base comprise a silicon nitride with a relatively lower silicon content. The spin-on dielectric precursor is deposited after forming the liner and is reacted to form an insulator for the STI trench. A highly silicon-based adhesion layer also helps alleviate insulator shrinkage problems that can arise from the densification process. An etch-back step, such as chemical mechanical polishing (CMP), can then be used to smooth the trench surface. A general process flow for forming such an isolation trench is described herein.

While silicon nitride and SOD materials are preferred, other materials are also available. The skilled practitioner will appreciate that the preferred materials have particular advantages, but the principles and advantages of the methods described herein are applicable to other materials.

Forming a Trench

Figure 1:
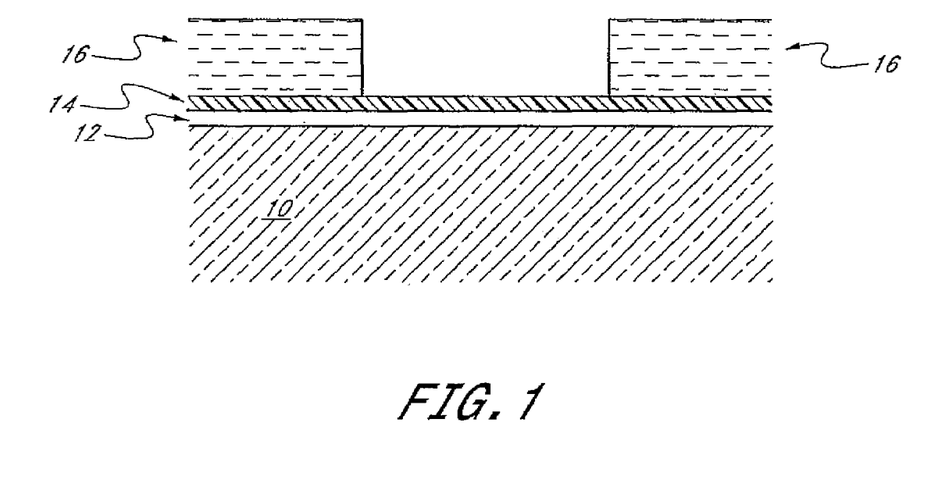
FIG. 1 is a schematic, cross-sectional side view of a substrate with a thin "pad oxide" grown over the surface of the substrate, a thicker layer of silicon nitride ($Si_3N_4$), and a photoresist mask in accordance with a starting point for preferred embodiments of the present invention.

An introductory step is the creation of a trench, preferably for shallow trench isolation (STI). The trench can be of varying widths, but in a preferred embodiment, the trench is less than a micron wide. As shown in FIG. 1, a semiconductor substrate 10, e.g., a silicon wafer, is provided and a thin "pad" oxide 12 is thermally grown on the substrate. In some embodiments, a thicker layer of a silicon nitride 14, preferably $Si_3N_4$, is formed over the pad oxide 12. The nitride 14 is preferably formed by chemical vapor deposition (CVD). This nitride layer 14 acts as a stop for a subsequent etch back, such as a CMP process. Exemplary thickness ranges are between about 30 Å and 100 Å for the pad oxide 12 and between about 200 Å and 1500 Å for the nitride layer 14.

Figure 2:
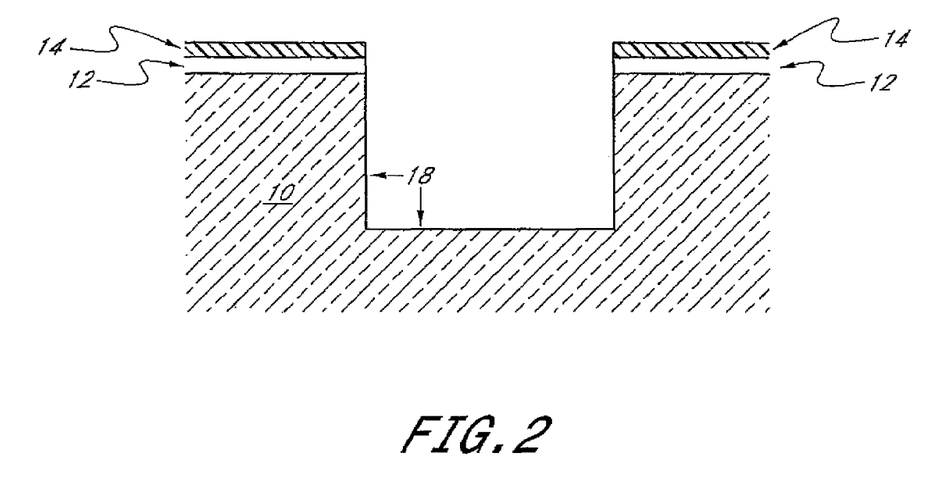
FIG. 2 is a schematic, cross-sectional side view of the substrate of FIG. 1 after a trench has been formed.

As shown in FIG. 1, a photoresist mask 16 is applied the substrate 10 in order to etch the trench. Photoresist is applied on the surface of the wafer. A reticle that blocks ultraviolet (UV) radiation is then placed over the wafer. The photoresist is then selectively exposed to UV radiation. Depending upon whether positive or negative resist is employed, the developing solution washes away either exposed or unexposed regions. Using the photoresist mask, a recess, preferably a trench for isolation, is formed in the substrate. After the trench is etched, the photoresist mask 16 of FIG. 2 is removed by conventional resist strip process. The trench depth is preferably between about 1,000 Å and 10,000 Å, more preferably between about 2,500 Å and 6,000 Å. The trench can also be formed through the use of a hard mask or by other methods. The skilled practitioner will appreciate that the trench can be formed by several different procedures.

The trench is preferably etched by an anisotropic etch, i.e. a directional etch, which produces relatively straight, vertical sidewalls. An exemplary etch process is reactive ion etch (RIE). As shown in FIG. 2, this method is quite accurate and straight. However, RIE can also damage the edges of transistor active areas, defined by the sidewalls 18 of the trench. In one embodiment (see FIG. 7 and accompanying description), the sidewalls 18 and base 19 are oxidized, forming a thin oxide layer in order to repair any damage from the anisotropic etch process.

Applying the Silicon Nitride Layer

After preparing the trench, a silicon nitride layer is deposited to line the trench. The nitride layer can be deposited by any of a variety of deposition methods, including CVD, atomic layer deposition (ALD), and sputtering. An additional method of deposition is ion-metal plasma deposition, a sputtering process with magnetic collimation. While silicon nitride deposited by CVD is described here, other materials and deposition processes can be used to form a liner layer.

Stoichiometric silicon nitride ($Si_3N_4$) has a silicon content of approximately 60% by weight, and a nitrogen content of about 40% by weight. In a preferred embodiment, the silicon content closest to the trench sidewall 18 is lower than the silicon content in the portion of the nitride layer farthest from the trench sidewalls 18. Conversely, in this embodiment, the nitrogen content of the nitride layer close to the trench sidewalls 18 is higher than the nitrogen content near the interior of the trench.

In several preferred embodiments illustrated in FIGS. 3A-3E, the nitride liners are formed by a CVD process. Skilled practitioners will appreciate that several precursors can be used to form silicon nitride layers of varying compositions. Some nitrogen precursors include ammonia ($NH_3$), which is a widely used precursor for many deposition processes, and nitrogen ($N_2$), which is used in processes such as plasma CVD. Exemplary silicon precursors include dichlorosilane (DCS) and other silane compounds. Preferably, DCS and $NH_3$ are used together to form a silicon nitride liner. The combination of these two precursors provides an excellent layer at relatively low temperatures.

As seen in FIGS. 3A-3E, the nitride layer can be deposited in several different methods. In a preferred embodiment, the nitride layer can be deposited in a single wafer chamber. The proportion of the precursors can be adjusted during the deposition of the nitride layer. In an example employing CVD, the nitride layer deposition can begin with a DCS flow rate of approximately 90 sccm, and a $NH_3$ flow rate of approximately 270 sccm. Using a single wafer chamber at between about 600° C. and 800° C., these flow rates will generally form a layer that is approximately stoichiometric silicon nitride ($Si_3N_4$) and has approximately 60% silicon by atomic weight. In the course of deposition the nitrogen source flow is reduced, relative to the silicon flow, or the silicon flow is increased relative to the nitrogen flow. For the given example, by the time the deposition of the nitride layer is completed, the DCS flow rate is preferably approximately 180 sccm, and the ammonia flow rate is unchanged. A nitride layer formed with these settings will be substantially more silicon-rich at approximately $Si_3N_2$, and a silicon content of approximately 80% by atomic weight.

The transition between these states can be accomplished in several methods. Distinct layers with increasing silicon content can be formed by stepped changes. In the illustrated embodiment in FIG. 3A, the nitride layer is formed as a bilayer 20 and 30 in two deposition steps. In the embodiment illustrated FIGS. 3B and 3C, the nitrogen content of the nitride layer 22 is gradually decreased. The resulting nitride layer 22 has smoothly graded nitrogen and silicon percentages. In the illustrated embodiment of FIGS. 3D and 3E, a nitrogen-rich layer 21 is formed in the trench. A nitrogen-graded layer 25 is formed over the "nitrogen-rich" layer 21. A silicon-rich nitride layer 31 is formed over the graded layer 25. Skilled practitioners will appreciate that there are a myriad of methods and patterns for decreasing the relative nitrogen content of the nitride layer or increasing the relative silicon content.

The liner layer (20 in FIG. 3A) closest to the trench walls 18 and base 19 preferably acts as a barrier layer. The nitrogen content by atomic weight close to the trench walls 18 is preferably between about 36% and 52%, more preferably between about 39% and 48%. Preferably the silicon content by atomic weight close to the trench walls is preferably between about 48% and 64%, more preferably between about 52% and 61%. The liner layer (30 in FIG. 3A) furthest from the trench walls 18 preferably acts as an adhesion layer. The silicon content by atomic weight in this adhesion layer is preferably between about 66% and 88%, more preferably between about 73% and 85%. The nitrogen content by atomic weight of the adhesion layer is preferably less than about 35%, more preferably between about 12% and 34%, most preferably between about 15% and 27%. However, the skilled practitioner will appreciate that the barrier layer and the adhesion layer need not be separate and distinct layers.

In a preferred embodiment shown in FIGS. 3A and 4-6, the liner is deposited in the trench in two steps. First a "nitrogen-rich" layer 20 is deposited, followed by a silicon-rich layer 30. In a preferred embodiment, the nitrogen-rich layer 20 is between about 30 Å and 200 Å thick, more preferably between about 50 Å and 100 Å. In a preferred embodiment, this nitrogen-rich 20 layer is deposited by CVD. For the nitrogen-rich layer 20, the gas flow for ammonia ($NH_3$) is preferably between about 200 sccm and 340 sccm. The gas flow rate for dichlorosilane ($SiH_2Cl_2$) is preferably between about 50 sccm and 135 sccm. A preferred ratio of nitrogen precursor to silicon precursor is between about 2.5:1 and 3.5:1, more preferably between about 2.7:1 and 3.3:1. Preferably, the temperature in a single wafer CVD chamber is between about 500° C. and 900° C., more preferably between about 600° C. and 800° C.

Figure 3A:
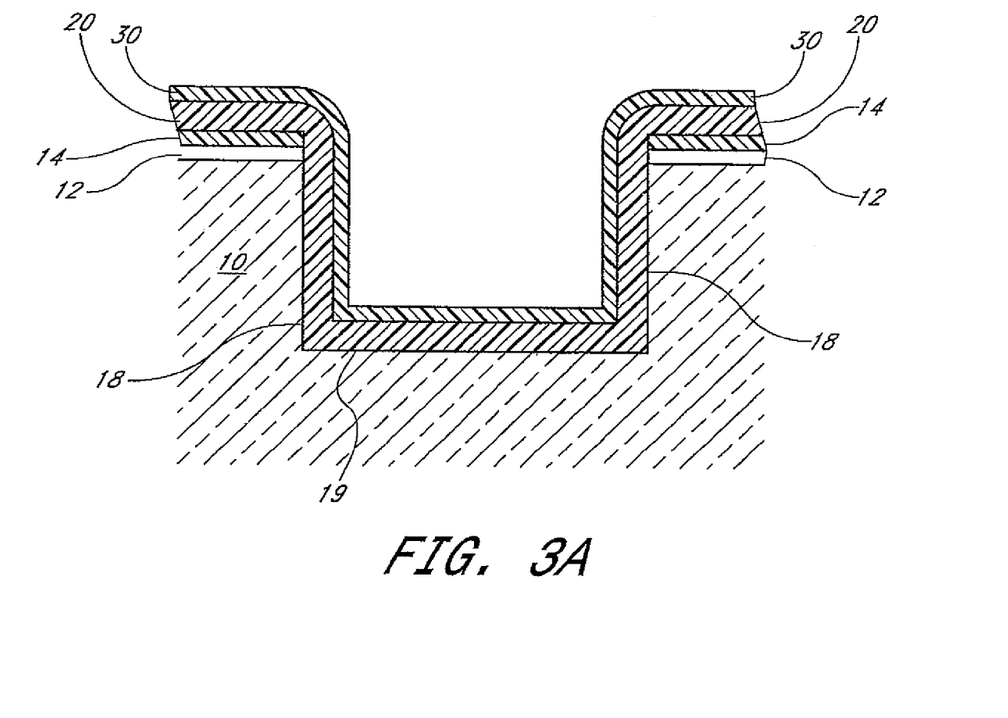
FIG. 3A is a schematic, cross-sectional side view of the substrate of FIG. 2 with a silicon nitride bilayer within the recess according to an embodiment of the present invention.

The "silicon-rich" layer 30 is preferably thinner than the nitrogen-rich layer 20 at between about 5 Å and 100 Å thick, more preferably between about 10 Å and 20 Å. The ratio of nitrogen precursor to silicon precursor for the silicon-rich layer 30 preferably decreases from the ratio of the nitrogen-rich layer 20 by between about 40% and 60%, more preferably by between about 45% and 55%. A preferred ratio of nitrogen precursor to silicon precursor is between about 1.1:1 and 2:1, more preferably between about 1.3:1 and 1.8:1. For the silicon-rich layer 30, the gas flow for ammonia is preferably between about 200 sccm and 340 sccm. The gas flow rate for DCS is preferably between about 140 sccm and 220 sccm. The temperature in a single wafer CVD chamber is preferably maintained between about 500° C. and 900° C., more preferably between about 600° C. and 800° C.

In an exemplary embodiment, a nitride layer is formed using two deposition steps as described above. In the first step, a 60 Å thick "nitrogen-rich" layer 20 was formed during a CVD process. The deposition process took 60 minutes to form using gas flow rates of 270 sccm of ammonia and 90 sccm of DCS. After the first step, the gas flow rates are then adjusted to 270 sccm of ammonia and 180 sccm of DCS. The silicon-rich layer 30 is formed in a process that takes 60 minutes to form a 60 Å thick layer. The temperature of the chamber was about 600° C. in this example.

Figure 3B:
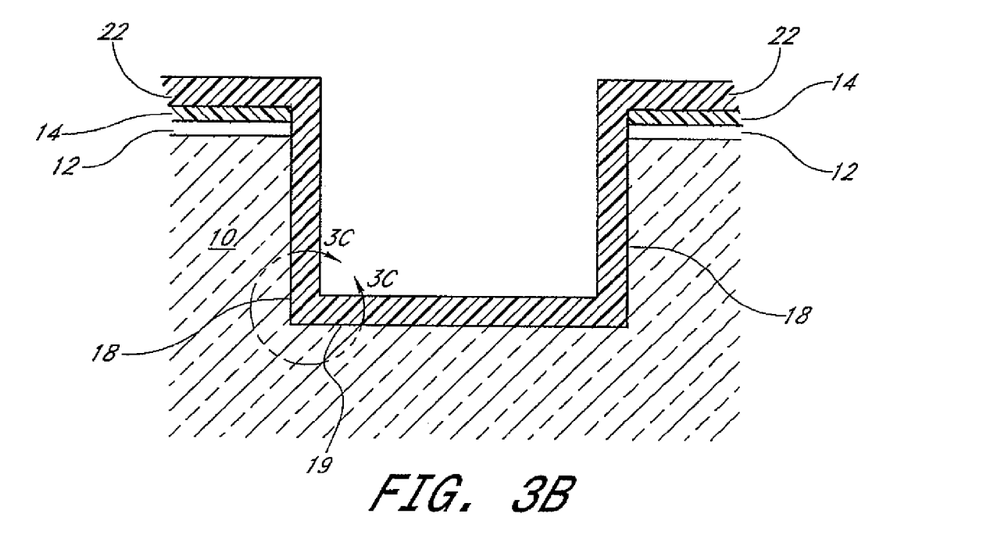
FIG. 3B is a schematic, cross-sectional side view of the substrate of FIG. 2 with a graded silicon nitride layer within the recess according to another embodiment of the present invention.
Figure 3C:
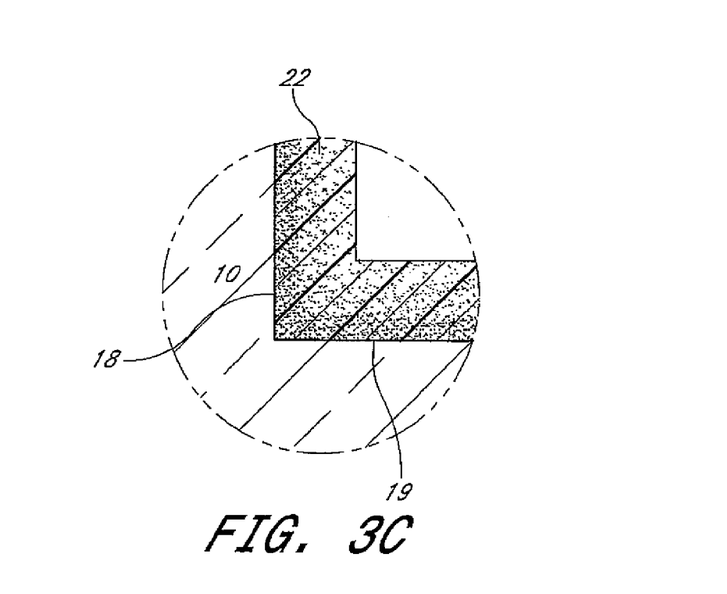
FIG. 3C is a close-up view of schematic, cross-sectional side view of the substrate of FIG. 3B with a graded silicon nitride layer.

In another embodiment illustrated in FIGS. 3B and 3C, the nitrogen content in the nitride layer 22 is graded down from a high level near the walls 18 and floor 19 of the trench, gradually decreasing as the deposition process continues. In this embodiment the deposition process is not stopped to change the gas flow rates; rather, the flow rates are adjusted during the deposition process. The nitrogen and silicon content of the nitride layer 22 is discussed above. In one embodiment, the flow rates begin at rates similar to the rates of the "nitrogen-rich" layer 20 described in reference to the embodiment of FIG. 3A, and end at rates similar to the rates for the "silicon-rich" layer 30 in that embodiment. In a preferred embodiment, the gradient will be linear across the entire nitride layer 22. Other gradient profiles can also be formed depending upon the operation of the deposition, specifically the adjustment of the flow rates.

Figure 3D:
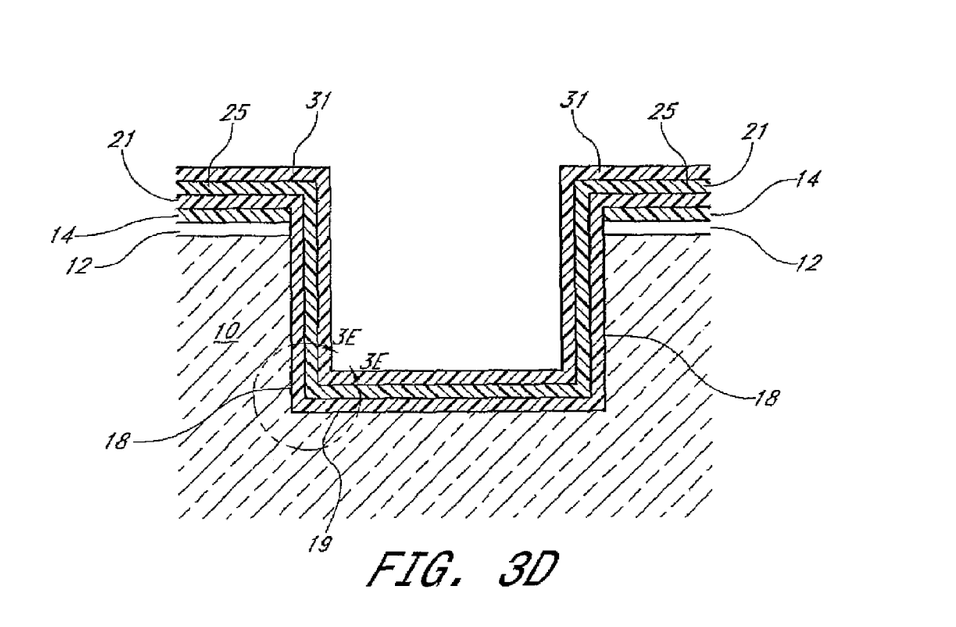
FIG. 3D is a schematic, cross-sectional side view of the substrate of FIG. 2 with a silicon nitride tri-layer within the recess according to an embodiment of the present invention.
Figure 3E:
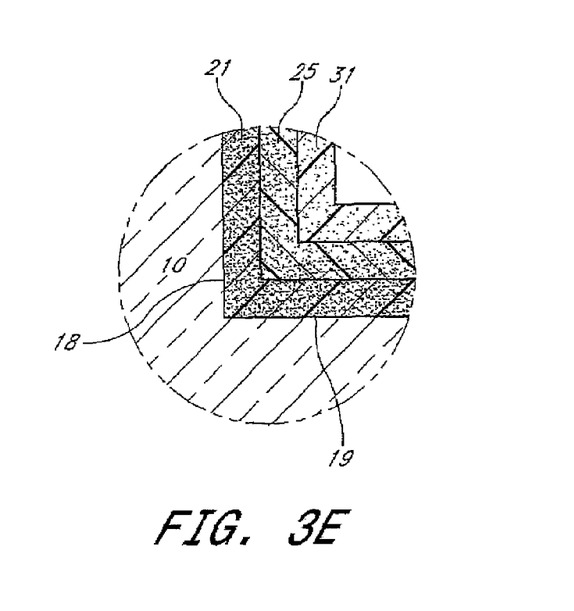
FIG. 3E is a close-up view of schematic, cross-sectional side view of the substrate of FIG. 3D.

In an embodiment illustrated in FIGS. 3D and 3E, the nitride layer consists of three layers. The layer closest to the trench walls 18 will be a "nitrogen-rich" layer 21, as in previous embodiments. Preferably the nitrogen content close to the trench walls 18 and floor 19 is similar to previous embodiments. Preferably this layer is between about 5 Å and 20 Å thick, more preferably between about 10 Å and 15 Å. An intermediate layer 25 will be graded from nitrogen-rich to silicon-rich, similar to the embodiments described with reference to FIGS. 3B and 3C. The gradient profile can be linear or nonlinear depending upon the flow rates and other operation factors of the deposition equipment. Preferably the graded layer is between about 10 Å and 100 Å thick, more preferably between about 20 Å and 50 Å. An outer layer will be a silicon-rich layer 31 with a thickness of between about 5 Å and 20 Å, more preferably between about 10 Å and 15 Å. Overall, the thickness of the trilayer is preferably similar to the total thickness of the nitride layer of previous embodiments.

Trench Fill Process

Once a nitride layer of one of the above embodiments has been deposited within the trench, the trench can be filled with an insulator. Preferably the insulator is a nonconductive oxide, such as silicon oxide. In a preferred embodiment, the trench is filled with a spin on material. Although the rest of the disclosure assumes use of the embodiment of FIG. 3A, the skilled artisan will appreciate that other embodiments, such as those described with reference to FIGS. 3B-3E, could also be used.

Figure 4:
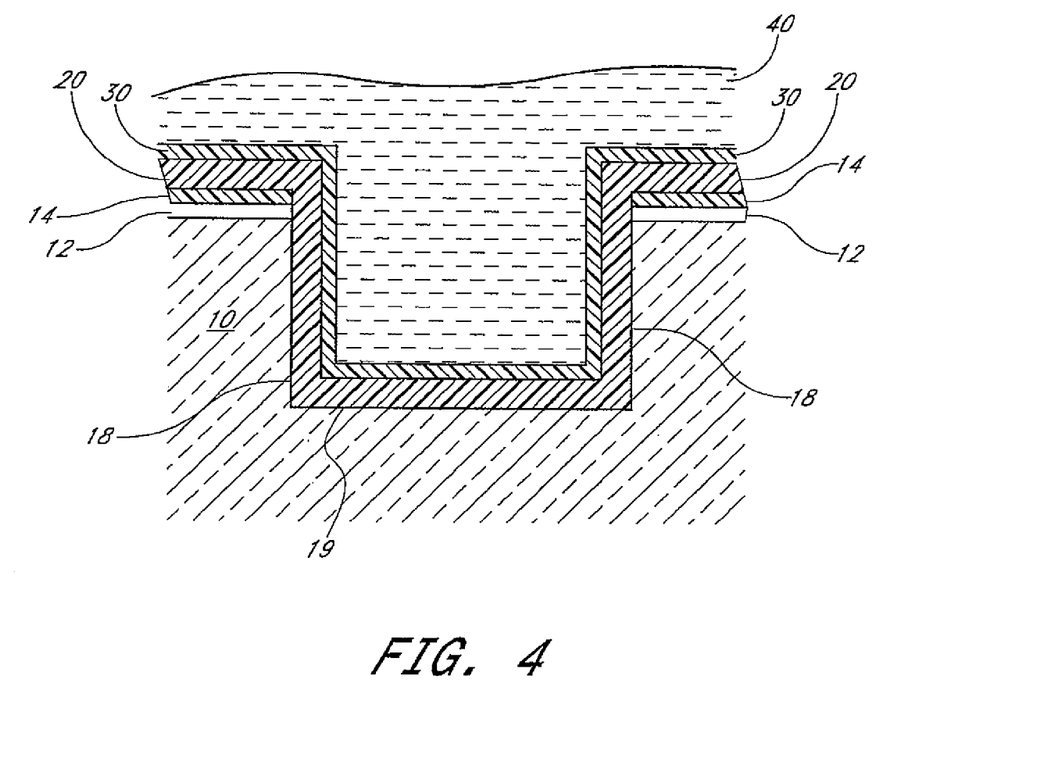
FIG. 4 is a schematic, cross-sectional side view of the substrate of FIG. 3A with a layer of spin-on dielectric material filling the trench.

In FIG. 4, an insulator precursor material 40 has been deposited within the trench. A spin-on deposition process is preferably used to deposit the precursor 40 into the remaining space in the trench, as shown in FIG. 4. The thickness of the precursor 40 will vary based upon the size of the trench, but in the illustrated embodiment the thickness of the material is preferably between 2500 Å and 5500 Å, more preferably between 3000 Å and 4500 Å.

Spin-on deposition uses liquid materials dripped on the substrate after formation of the isolation trenches. The wafer is rapidly spun, which spreads the liquid uniformly over the surface of the wafer after filling the low points on the wafer. An example of a spin-on material is Spinfil™ made by Clariant (Japan) K.K.-Life Science & Electronic Chemicals of Tokyo, Japan. This product is a polysilazane based inorganic spin-on dielectric precursor. However, the skilled practitioner will appreciate that many dielectric materials can be used for these purposes.

Once the insulating precursor 40 has been deposited into the trench, the precursor 40 is converted to oxide. Clariant's Spinfil™ SOD precursor, based upon perhydrosilazane ($SiH_2NH$), has a recommended conversion/densification recipe as follows:

1) 3 min of hot plate baking at 150° C.,
2) 30 min at 700-800° C. in steam ambient
3) Annealing for STI at 800-1000° C. in dry oxygen.

However, this process was found problematic for trenches that are very small, particularly where trenches of a variety of widths across the substrate are to be filled. With this process, during the subsequent etchings, CMP, and wet cleans, the trench-fill material has been found to recess too much. SOD materials tend to have between about 10 percent and 30 percent volume shrinkage upon densification. This can be somewhat offset by other layers in the trench feature expanding. A silicon-rich layer can expand during the SOD conversion process to offset volume shrinkage as well as provide a re-bond improvement.

A more preferred densification process is described in an application by Smythe, et al. (filed Feb. 19, 2004, application Ser. No. 10/782,997), which is hereby incorporated by reference. The densification process of that application uses a ramped temperature process. A prepared wafer is placed in a chamber. The wafer is preferably heated to an initial temperature of between about 200° C. and 600° C., more preferably between 300° C. and 500° C. Preferably, steam is then turned on in the chamber. From the initial temperature, the heat ramps up to a target temperature between approximately 800° C. and 1200° C., more preferably between 900° C. and 1100° C., and most preferably between 950° C. and 1050° C. The increase of the temperature in the chamber is stopped when it gets to this target temperature. The temperature can increase approximately between about 3° C. per minute to 25° C. per minute, more preferably between about 8° C. and 20° C. During the escalation of the temperature, the wafer is in an oxidizing environment, preferably an ambient steam environment. After the temperature is ramped up, the wafer is annealed for approximately 10 to 40 minutes, more preferably between 15 min and 35 min, at the temperature plateau on steady state. In the preferred embodiment, the wafer is annealed in a second oxidizing environment, preferably in a dry oxygen ($O_2$) environment. Finally, after the process is done, the wafer is removed from the chamber.

In this process the steam reacts with the polysilazane on the heated substrate. As the temperature rises, the reaction begins to increase the rate of oxidation. The chemical reaction associated with the densifying process of the preferred spin-on dielectric, polysilazane, is shown below:

$$Si_xN_yH_z + H_2O \rightarrow SiO_2 + H_2 + NH_3$$

Figure 5:
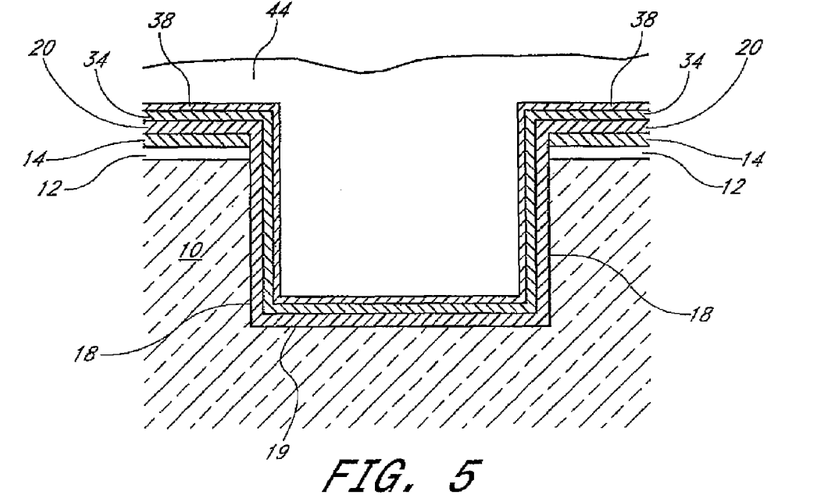
FIG. 5 is a schematic, cross-sectional side view of the substrate of FIG. 4 after a curing and densification process.

FIG. 5 shows the trench and surrounding area after the conversion process. Because the portion of the nitride layer 30 (FIG. 4) that is in contact with the insulating precursor 40 (FIG. 4) was silicon-rich, the interface between the resulting insulator 44 and the liner layer 34 will be smooth. The densification process consumes some of the silicon from the silicon-rich layer 30 (FIG. 4) and leaves a less silicon-rich layer 34 and a layer of silicon oxynitride (SiON) 38 at the interface of the silicon nitride layer 34 and the densified silicon oxide insulator 44. During the densification process, the gradient of the nitrogen content and the silicon content may be smoothed out as a result of the high heat.

Figure 6:
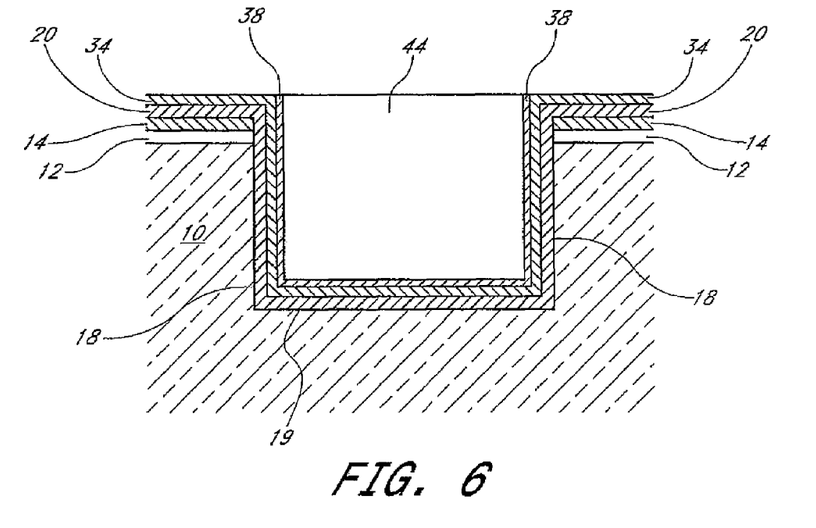
FIG. 6 is a schematic, cross-sectional side view of the substrate of FIG. 5 after etching back the oxide down to the top nitride surface.

As seen in FIG. 6, the oxide 44 in the trench is preferably etched back with a chemical mechanical polishing (CMP) process. The CMP process preferably stops on the silicon nitride layer 34 when using a two layer silicon nitride layer. However, if the silicon nitride layer 30 is particularly silicon-rich or was substantially oxidized by the densification process, the CMP process can be stopped by the "nitrogen-rich" silicon nitride layer 20. When the layer has a graded nitrogen content from the sidewalls and base inward, the CMP process can also stop within the silicon nitride layer.

Structure

An embodiment is seen in FIG. 6 after an etch back of the oxide. Through the use of the spin-on deposition process, the trench is preferably filled without voids, which can negatively affect the isolation effects of the trench. It can be seen in FIG. 6 that the spin-on material 44 has been reacted into silicon oxide, which provides excellent insulation. The silicon oxide 44 adheres well to the surface of the remaining silicon nitride layer 34. Preferably, a silicon oxynitride layer 38 is formed at the interface of the silicon oxide 44 and the nitride layer 34. In a preferred embodiment, the silicon oxynitride layer is between about 5 Å and 20 Å thick, more preferably between about 10 Å and 15 Å.

Depending on the densification process, the nitrogen content gradient and silicon content gradient of the nitride layers 20 and 34 in the completed trench structure can be substantially altered. When the heat is high, such as in the exemplary process described above, the nitrogen gradient may be somewhat smoothed by diffusion between the "nitrogen-rich" layer 20 and the remaining silicon-rich layer 34. However, even after processing, the silicon-rich layer 34 preferably has a higher silicon content than the nitrogen-rich layer 20. Preferably, after processing, the nitrogen-rich layer 20 will have between about 48% and 64% silicon by atomic weight, more preferably between about 52% and 61% silicon by atomic weight. The remaining silicon-rich layer 34 will have preferably between about 50% and 85% silicon by atomic weight, more preferably between about 60% and 80% silicon by atomic weight, and most preferably between about 70% and 75% silicon by atomic weight.

Figure 7:
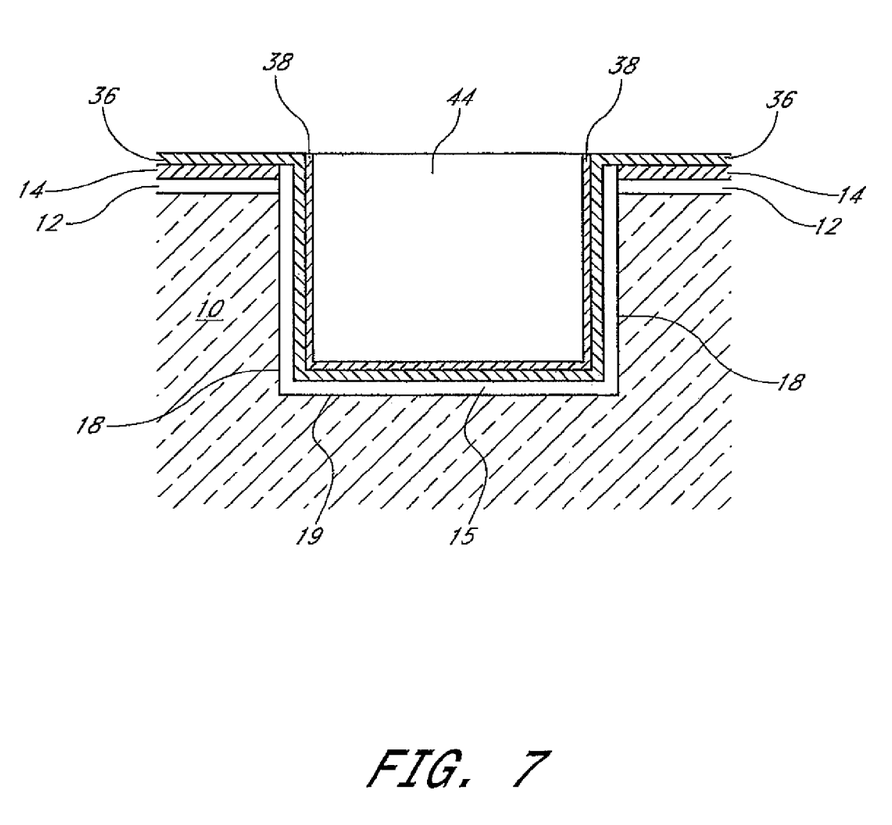
FIG. 7 is a schematic, cross-sectional side view of a substrate with an isolation trench with a graded nitride layer according to a preferred embodiment.

FIG. 7 is an illustration of a trench using a nitride liner 22 similar to that of FIG. 3B. The trench has been filled with an oxide 44, which has been etched back. In this embodiment, the graded nitride layer 36 has provided an adhesion layer for formation of the oxide 44. Preferably, after processing, the portion of a resultant nitride layer 36 closest to the trench walls 18 and base 19 will have between about 48% and 64% silicon by atomic weight, more preferably between about 52% and 61% silicon by atomic weight. The portion of the nitride layer 36 furthest from the trench walls 18 and base 19 will have preferably between about 50% and 85% silicon by atomic weight, more preferably between about 60% and 80% silicon by atomic weight, and most preferably between about 70% and 75% silicon by atomic weight.

Additionally, FIG. 7 illustrates an oxide layer 15 along the walls 18 and base 19 of the trench resulting from oxidizing the surfaces of the trench before depositing a graded nitride liner 22 similar to that of FIG. 3B. The oxide layer 15 preferably has a thickness of between about 30 Å and 100 Å. The oxidation of the trench walls 18 and base 19 serves to repair damage from the trench formation. The oxide layer 15 also protects the active areas in the substrate 10 from damage that might be caused during processing. A similar oxide layer can be formed in other embodiments described herein.

It will be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method of forming an isolation structure comprising:
   forming a recess within a substrate, wherein the recess has a base and sidewalls;
   depositing a first nitride layer within the recess, wherein depositing the first nitride layer comprises depositing a nitride layer with a nitrogen content by weight of between about 39% and 52%;
   depositing a silicon-rich second nitride layer over the first nitride layer; and
   depositing an insulator precursor within the silicon-rich second nitride layer.

2. The method of claim 1, wherein depositing the first nitride layer comprises depositing substantially stoichiometric silicon nitride ($Si_3N_4$).

3. A method of forming an isolation structure comprising:
   forming a recess within a substrate, wherein the recess has a base and sidewalls;
   depositing a first nitride layer within the recess;
   depositing a silicon-rich second nitride layer over the first nitride layer, wherein depositing the silicon-rich second nitride layer comprises depositing a nitride layer with a nitrogen content by weight of between about 12% and 34%; and
   depositing an insulator precursor within the silicon-rich second nitride layer.

4. The method of claim 3, wherein forming the recess comprises forming a shallow trench isolation (STI) trench.

5. The method of claim 3, wherein forming the recess comprises using a reactive ion etch process.

6. The method of claim 3, further comprising densifying the insulator precursor to form silicon oxide.

7. The method of claim 3, further comprising oxidizing the base and sidewalls of the recess before depositing the first nitride layer.

8. The method of claim 3, wherein depositing an insulator precursor comprises depositing a spin on glass precursor.

9. The method of claim 3, wherein forming a recess comprises using a reactive ion etch process.

10. The method of claim 3, wherein depositing the first nitride layer and depositing the second nitride layer comprise using chemical vapor deposition (CVD) processes.

11. The method of claim 10, wherein depositing the first nitride layer comprises flowing between about 200 sccm and 340 sccm of ammonia into a single wafer chamber.

12. The method of claim 10, wherein depositing the first nitride layer comprises flowing between about 50 sccm and 135 sccm of dichlorosilane into a single wafer chamber.

13. The method of claim 10, wherein depositing the second nitride layer comprises flowing between about 200 sccm and 340 sccm of ammonia into a single wafer chamber.

14. The method of claim 10, wherein depositing the second nitride layer comprises flowing between about 140 sccm and 220 sccm of dichlorosilane into a single wafer chamber.

15. A method of isolating electrical components in an integrated circuit, comprising:
    forming a trench within a substrate;
    depositing a silicon nitride layer within and lining the trench, wherein depositing the silicon nitride layer comprises adjusting the deposition of the silicon nitride layer to produce a lower nitrogen content in an interior portion of the nitride layer compared to an outside portion of the silicon nitride layer; and
    depositing a spin-on dielectric precursor within the silicon nitride layer.

16. The method of claim 15, further comprising densifying the spin-on dielectric precursor to form a dielectric.

17. The method of claim 15, wherein depositing the silicon nitride layer comprises using a sputtering deposition process.

18. The method of claim 15, wherein depositing the silicon nitride layer comprises using a chemical vapor deposition process.

19. The method of claim 18, wherein depositing the silicon nitride layer comprises depositing a silicon nitride layer with a silicon gradient from a low silicon percentage at an early deposition stage to a higher silicon percentage at a later deposition stage.

20. The method of claim 18, wherein depositing the silicon nitride layer comprises forming a plurality of nitride layers.

21. The method of claim 20, wherein forming the plurality of nitride layers comprises adjusting a set of precursor gas flow rates step-wise.

22. The method of claim 20, wherein forming the plurality of nitride layers comprises pausing between depositing each nitride layer.

23. The method of claim 20, wherein forming the plurality of nitride layer comprises forming a first nitride layer and forming a second nitride layer with a higher silicon content than the first nitride layer.

24. The method of claim 20, wherein forming the plurality of nitride layer comprises
    forming a first nitride layer with a low silicon percentage;
    forming a second nitride layer with a silicon gradient from the low silicon percentage to a high silicon percentage; and
    forming a third nitride layer, wherein the third nitride layer has a higher silicon percentage.

25. A method of isolating electrical components on a substrate, comprising:
    forming a recess in the substrate;
    depositing a graded silicon nitride layer within the recess, wherein depositing the graded silicon nitride layer comprises decreasing a nitrogen percentage while depositing the silicon nitride layer, wherein depositing the graded silicon nitride layer comprises depositing a silicon nitride layer with a nitrogen percentage by weight beginning at between about 39% and 52% and decreasing to between about 12% and 34%;
    depositing an insulation precursor in the recess after depositing the silicon nitride layer; and
    forming an insulator from the insulation precursor.

26. A method of isolating electrical components on a substrate, comprising:
    forming a recess in the substrate;
    depositing a graded silicon nitride layer within the recess, wherein depositing the graded silicon nitride layer comprises decreasing a nitrogen percentage while depositing the silicon nitride layer;

depositing an insulation precursor in the recess after depositing the silicon nitride layer, wherein depositing an insulation precursor within the silicon nitride layer comprises depositing a spin-on dielectric precursor; and forming an insulator from the insulation precursor.

27. The method of claim 26, wherein forming the insulator from the insulation precursor comprises:

curing the spin-on dielectric precursor in a curing chamber in a steam ambient environment, wherein the temperature in the curing chamber ramps from an initial temperature of between about 200° C. and 600° C. to a target temperature of between about 800° C. and 1200° C. at a rate of between about 3° C. and 25° C. per minute while the substrate is in the curing chamber; and annealing the substrate at a temperature of between about 800° C. to 1200° C. for between 10 and 40 minutes after the substrate has been cured.

28. A method of forming an isolation trench in an integrated circuit, comprising:

forming a trench in a substrate;

lining the trench with a silicon nitride layer, wherein the silicon nitride layer has a nitrogen content by atomic weight of less than about 34% at an inner surface; and depositing an insulator in the trench after lining the trench.

29. The method of claim 28, wherein depositing the insulator comprises depositing a spin-on dielectric over the silicon nitride layer.

30. The method of claim 29, wherein depositing the insulator comprises ramping a temperature setting from an initial temperature to a higher final temperature.

31. The method of claim 28, further comprising lining the trench with a barrier layer before lining the trench with the silicon nitride layer.

32. The method of claim 31, wherein lining the trench with a barrier layer comprises forming a silicon nitride layer with a nitrogen content by atomic weight of between about 39% and 52%.

33. A method of forming an isolation trench, comprising:

lining a trench with a barrier layer;

depositing an adhesion layer over the barrier layer, wherein the adhesion layer has a silicon content by weight of between about 66% and 88%; and depositing a spin-on insulation precursor in the trench after depositing the adhesion layer; and forming an insulator from the insulation precursor.

34. The method of claim 33, wherein depositing the adhesion layer comprises depositing a layer with a silicon content by weight of between about 73% and 85%.

35. The method of claim 33, wherein forming the insulator comprises forming silicon oxide in the trench.

36. The method of claim 35, wherein forming silicon oxide comprises forming a spin-on dielectric.

37. The method of claim 35, further comprising etching back the silicon oxide.

38. The method of claim 33, wherein lining the trench comprises forming a silicon nitride layer.

39. The method of claim 33, wherein lining the trench and depositing the adhesion layer comprises using a chemical vapor deposition process.

40. The method of claim 33, wherein depositing the insulator precursor comprises depositing a spin-on precursor.

41. The method of claim 40, wherein depositing the spin-on precursor comprises depositing a polysilazane based oxide precursor.

42. The method of claim 33, wherein forming the insulator from the precursor comprises ramping a temperature setting up from an initial temperature to a higher final temperature.

* * * * *